Sept. 5, 1967 K. CLARK ET AL 3,339,704

CHIP ORIENTATION SENSOR

Filed May 27, 1965 3 Sheets-Sheet 1

CHIP ORIENTATION SENSOR

Filed May 27, 1965 3 Sheets-Sheet 2

Sept. 5, 1967 K. CLARK ET AL 3,339,704

CHIP ORIENTATION SENSOR

Filed May 27, 1965 3 Sheets-Sheet 3

United States Patent Office 3,339,704

Patented Sept. 5, 1967

3,339,704
CHIP ORIENTATION SENSOR

Kendall Clark, Poughkeepsie, Eugene J. Creighton, Wappingers Falls, and Joseph G. Drop and George R. Santillo, Jr., Poughkeepsie, N.Y., assignors to International Business Machines Corporation, New York, N.Y., a corporation of New York

Filed May 27, 1965, Ser. No. 459,380
6 Claims. (Cl. 198—33)

This invention relates to apparatus for assembling work pieces into component units, more specifically to apparatus for automatically assembling semiconductor chips on printed circuit substrates. Still more specifically, this invention relates to apparatus for sensing the relative position of a work piece having projections thereon arranged in a geometrical configuration, more specifically to an apparatus for automatically sensing the angular orientation of semiconductor chips having projecting terminals thereon, and producing a signal in response to the position of the projecting terminals that can be used by associated apparatus to properly orientate the semiconductor chip.

With the advent of hybrid transistor circuit technology, there arose more stringent requirements of precision, speed and uniformity than had theretofore been achieved in the art of automated circuit manufacture. This hybrid technique involves first the screen printing of the resistors and conductive lands on an alumina substrate. The transistors or diodes in the form of semiconductor chips are then positioned onto the conductive lands. Because the chips are almost microscopic in size, each measuring 0.028 inch square, and are joined to the lands by contact elements in the form of copper balls which are only 0.005 inch in diameter, they cannot be handled by conventional automated assembly techniques. The problem is further complicated by the need for extreme accuracy and precision in positioning the chips on the relatively small and closely-spaced conductive lands which are only 0.005 to 0.015 inch wide and 0.005 inch apart, as well as by the extreme delicacy of the structure involved.

Furthermore, the vast number of circuit substrates required in the manufacture of each digital computer, which is at present the primary use for this hybrid circuit technology, demands that the chip positioning operation be performed at relatively high speeds and with a high yield in order to maintain the high volume required in production. The large number of circuit substrates utilized in a single computer also demands uniformity in manufacture in order to increase the reliability of the final assembled apparatus.

Because of the very small size of the semiconductor chips, manually orienting and placing them on substrates is a very tedious, time-consuming and expensive operation. The human error in such an operation is relatively great. Since hybrid transistor circuit terminology is a very recent development, the teachings of the prior art are relatively devoid of suitable apparatus capable of performing this very precise and exacting operation of selecting chips and properly orienting them on the substrate. It can therefore be appreciated that there is a very great need for automatic apparatus that will dependably and consistently perform the above mentioned operation.

We have invented a new apparatus for sensing the relative position of a work piece. The apparatus of our invention has a sensing station having a plurality of movable sensing elements adapted to engage portions of the work piece. A plurality of switches are provided with linkage means operatively connecting same to the sensing elements. Linkage means are provided which operatively connect each of said sensing means in actuating relation to one of said switches. Desirably, a means for accurately positioning a work piece in sensing position at the sensing station is also provided.

The work piece sensing apparatus of our invention represents a very significant advance in the automation of electrical component assembly. The apparatus of our invention will in use rapidly and dependently sense the position of very small semiconductor chips supported on a vacuum probe or needle by "feeling" the position of the protruding ball terminals, and in response thereto produce a signal which can be used to reorient the chip with an associated apparatus.

An object of this invention is to provide a new apparatus for detecting the position of a work piece.

Another object of this invention is to provide a new apparatus for detecting the position of a semiconductor chip having a plurality of projecting terminals.

Yet another object of this invention is to provide a new apparatus for detecting the position of a semiconductor supported on a work support and produce a signal in response to the position which can be utilized to reorient the chip with a suitable associated apparatus.

These and other objects of the invention become apparent to those skilled in the art from the disclosure in the following specification, appended claims and drawings, wherein like numerals designate like parts.

Figure 1:
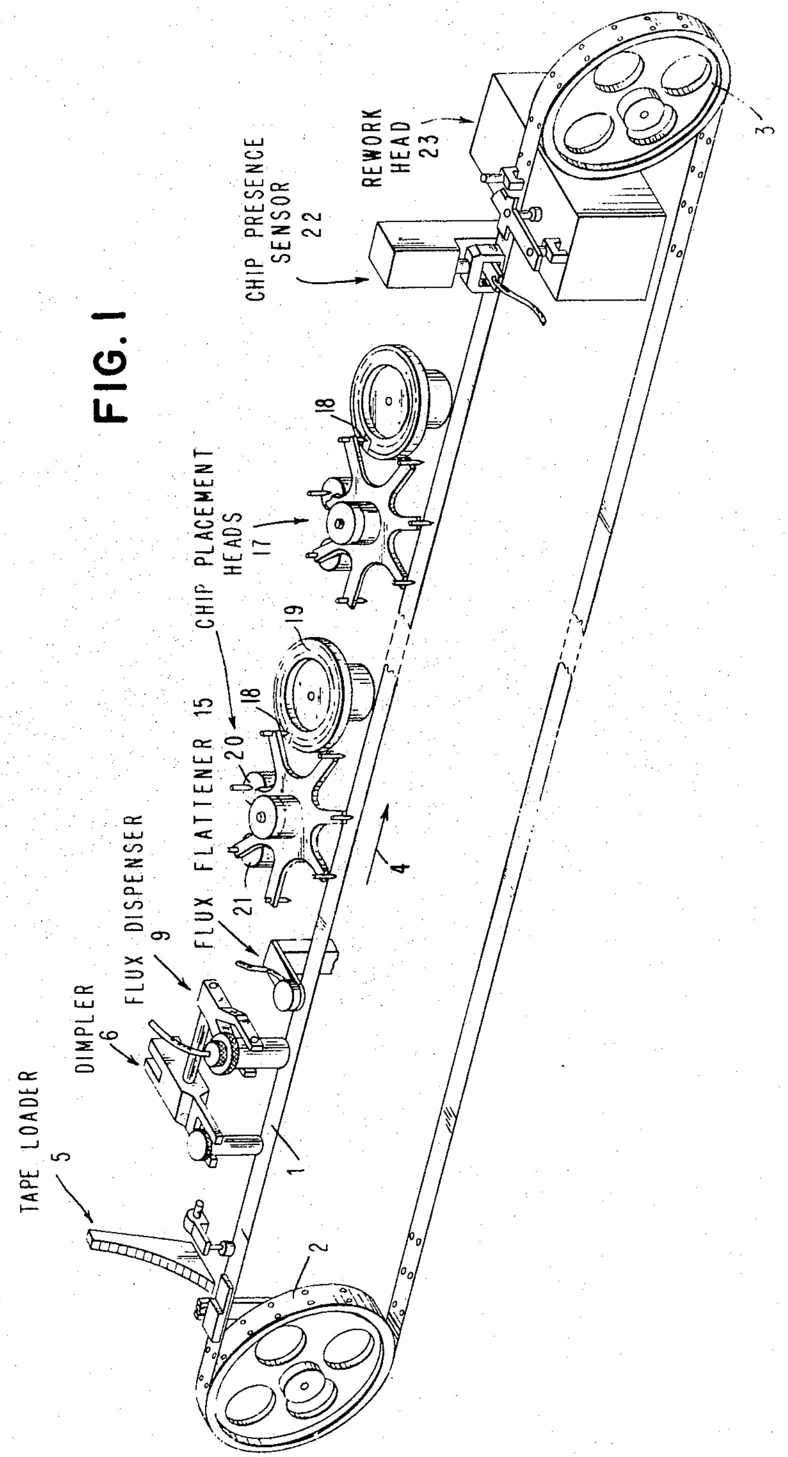
FIG. 1 is a diagrammatic view in perspective illustrating the arrangement of the chip positioning combination apparatus in which the chip orientation sensor is a component part thereof.

The figures of the drawing and the following discussion thereof depict and describe preferred specific embodiments of the chip orientation sensor of our invention, as it is understood that such is not to unduly limit the scope of our invention.

Referring now to the figures of the drawing, there is shown in FIG. 1 the general overall chip positioning machine of which the chip orientation sensor apparatus of this application is a component element thereof. Referring to FIG. 1, the successive operating stations are shown schematically. A series of substrates are carried in sequence from one station to the next by a metal conveyor tape 1 entrained around a pair of pulleys 2 and 3 so that the upper run of tape 1 moves in the direction from left to right as viewed in the drawing. Tape loader 5 constitutes the first station and loads the substrates onto tape 1.

At the next station, a dimpler 6 is provided with an array of coining punches to dimple a circular flat area 0.007 inch in diameter on each of the pads of the substrate. These flat areas are to receive the copper balls, that is the ball terminals or contacts, B, of the chip C when the latter are placed on the substrate at the subsequent operating stations.

The next station is a flux dispenser 9 wherein droplets of flux are discharged onto the substrate area in the appropriate locations preparatory to affixing the chips to the substrate.

To reduce the flux droplet height, a flux flattener, indicated generally as 15, is provided which emits a jet of compressed air against each of the flux droplets to flatten and spread same on the substrate.

The next station constitutes a series of rotary turret chip placement heads, indicated generally as 17. The number of chip placement heads will correspond to the number of chips to be positioned upon each of the substrates, since each head 17 positions a chip at a particular location on the printed circuit pattern.

After the substrates are carried by the tape conveyor 1 from the last of the series of chip placement head 17, the next operating station in the sequence is a chip presence sensor 22. This device tests each substrate to determine if the required number of chips have been positioned thereon. Each substrate is thereby characterized as an "accept" or "reject" and this characterization is retained in the memory circuitry of the electrical control system until the substrate is carried by conveyor 1 to a rework head 23. This final station may be selectively programmed to remove from tape conveyor 1 either all of the accepted substrates or all of the rejected substrates. Generally, it is programmed to remove all of the rejected substrates so that the latter may be reworked, usually by operators manually positioning chips at the missing locations. The accepted substrates continue on conveyor tape 1 toward its discharge end where they are removed by suitable interface apparatus (not shown) and loaded upon a subsequent conveyor for passage through the chip bonding oven (not shown).

Referring now to the rotary turrent chip placement turret head 17, there is provided at indexing stations a vibratory bowl feeder 19, a chip orientation sensor 20, and a chip T-bar orientor 21. In operation, semiconductor chips are deposited in vibratory bowl feeder 19 where they are manipulated to a pick-upstation in an upright position with the copper ball terminals B down. The chip is then picked up by the vacuum probe or needle 18 and indexed to chip orientation sensor 20. At the chip orientation sensor 20, the chip is lowered on the probe 18 to a sensing station wherein there is produced in response to the position of the ball terminals an electrical signal which is transferred to chip T-bar orientor 21. With the proper circuitry the electrical signal is utilized to position the T-bar head of the chip T-bar orientor to receive the ball terminals of the chip in engagement therewith so that it can be rotated to the desired position. After the semiconductor chip has been oriented it is indexed to the tape conveyor 1 and properly positioned on a substrate.

A more comprehensive and detailed discussion and description of the components, electrical circuitry, etc. of the chip positioner apparatus is contained in co-pending and commonly assigned U.S. application Ser. No. 459,179, filed May 27, 1965, entitled "Chip Positioning Machine."

*Chip orientation sensor*

Figure 7:
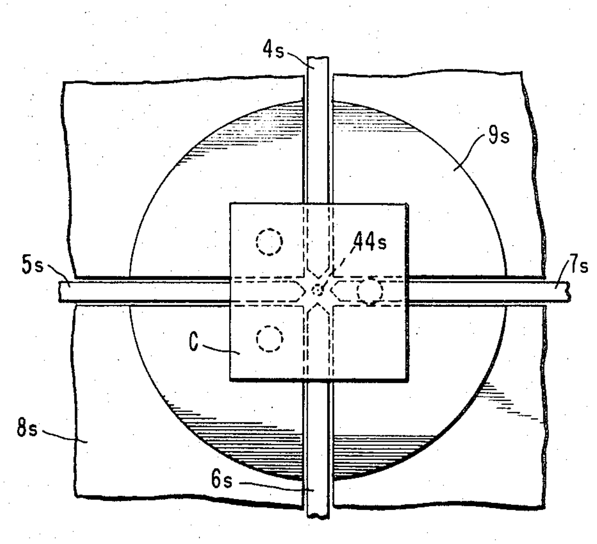
FIG. 7 is a detailed view in greatly enlarged scale showing the sensing station of the chip orientation sensor of our invention.

After the semiconductor chip is picked up from the vibratory bowl feeder 19 it is transferred to the chip orientation sensor 20 to determine the relative location of the terminal ball contacts B preparatory to its placement on the substrate. Basically, the function of the chip orientation sensor 20 is to determine the position of the ball terminals and produce an electrical signal that will enable the chip orientor 21 to reposition the chip if it is positioned improperly. The ball contacts on the semiconductor chip are arranged in a triangular pattern, as illustrated in FIG. 7. The chip C must be oriented on the probe 18 to the proper position so that it can be placed in the proper relation on the substrate when the probe arrives over the tape belt conveyor 3.

In FIGS. 2 to 7 there is illustrated a preferred specific embodiment of the semiconductor chip orientation sensor 20 for use on the combination apparatus of the invention.

Figure 6:
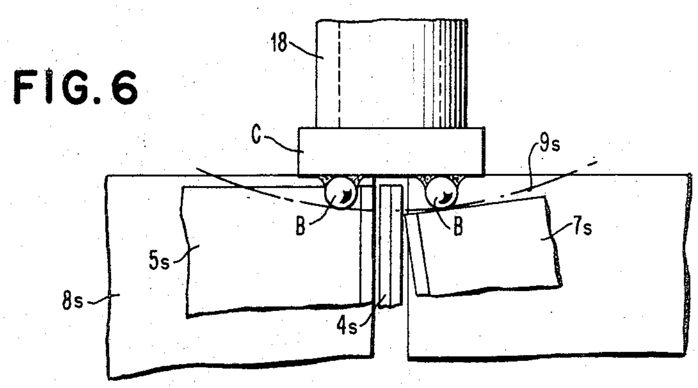
FIG. 6 is a detailed view in broken section in greatly enlarged scale of a side elevational view of the sensing station.
Figure 5:
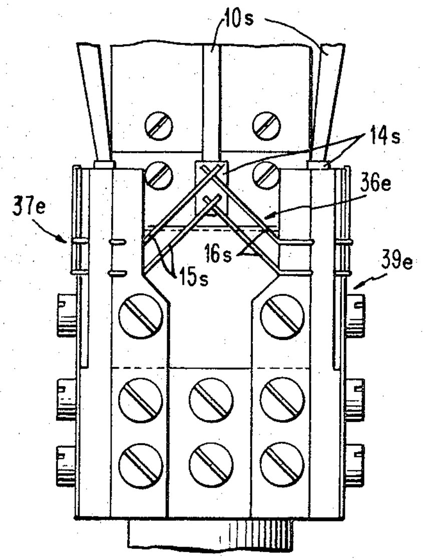
FIG. 5 is a detailed view in broken section taken on line 5—5 of FIG. 3.

The chip orientation sensor 20 has a base 2s which serves as a mounting element for the numerous components of the sensor. A head 3s is affixed to the top of base 2s, as most clearly shown in FIGS. 3 and 4. The actual sensing elements of the orientation sensor 20 are four separate blade elements 4s, 5s, 6s and 7s, shown in greatly enlarged scale in FIG. 7. When a semiconductor chip C is moved downwardly over the blades and properly positioned relative to same, one of the ball contacts B will depress one, and only one, of the blades. In FIG. 6 there is illustrated a ball contact B depressing blade 7s. It can be seen that since the semiconductor chip is square there are four possible angular positions in which it can be positioned on the probe 18, and only one of which is the proper position.

The four blades 4s, 5s, 6s and 7s are positioned in a blade guide 8s in which there are provided four separate slots that receive the blades. As most clearly indicated in FIG. 6, a concave depression 9s is machined in the top surface of blade guide 8s. The concave depression 9s allows sufficient clearance for the two remaining ball terminals B that do not contact and depress the knife blades. As more clearly shown in FIG. 3, each of the blades is supported on an L-shaped pivot arm 10s. Upright pivotal supports 11s, provided with bifurcated portions 12s to receive and pivotally support arms 10s, are mounted in base 2s. It can be seen that when a blade is depressed the lower end of the L-shaped arm 10s is pivoted outwardly. The lower ends of the arms 10s are provided with insulating pads 14s which serve as a means to close contacts 15s and 16s of electrical switches 36e, 37e, 38e and 39e. Both contacts 15s and 16s are mounted on base 2s and insulated therefrom. Outward movement of the lower end of arm 10s forces the electrical contacts 16s outwardly into contact with contacts 15s to close the electrical switch. It can be seen, assuming that the semiconductor chip is not defective, that each of the four possible positions will produce a different signal considering the four separate switches. An electrical signal is then produced with this switch arrangement which is used to actuate a chip T-bar orientor at the following station to properly turn the chip on the probe, if such is necessary, when it arrives at the station.

Figure 2:
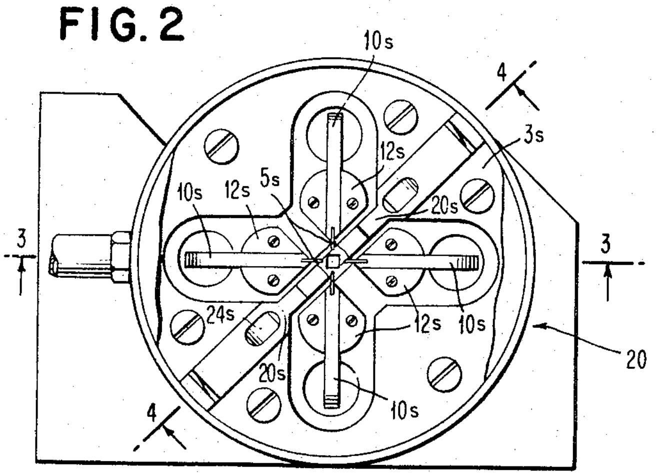
FIG. 2 is a top plan view of a specific embodiment of the chip orientation sensor apparatus of our invention.
Figures 3, 4:
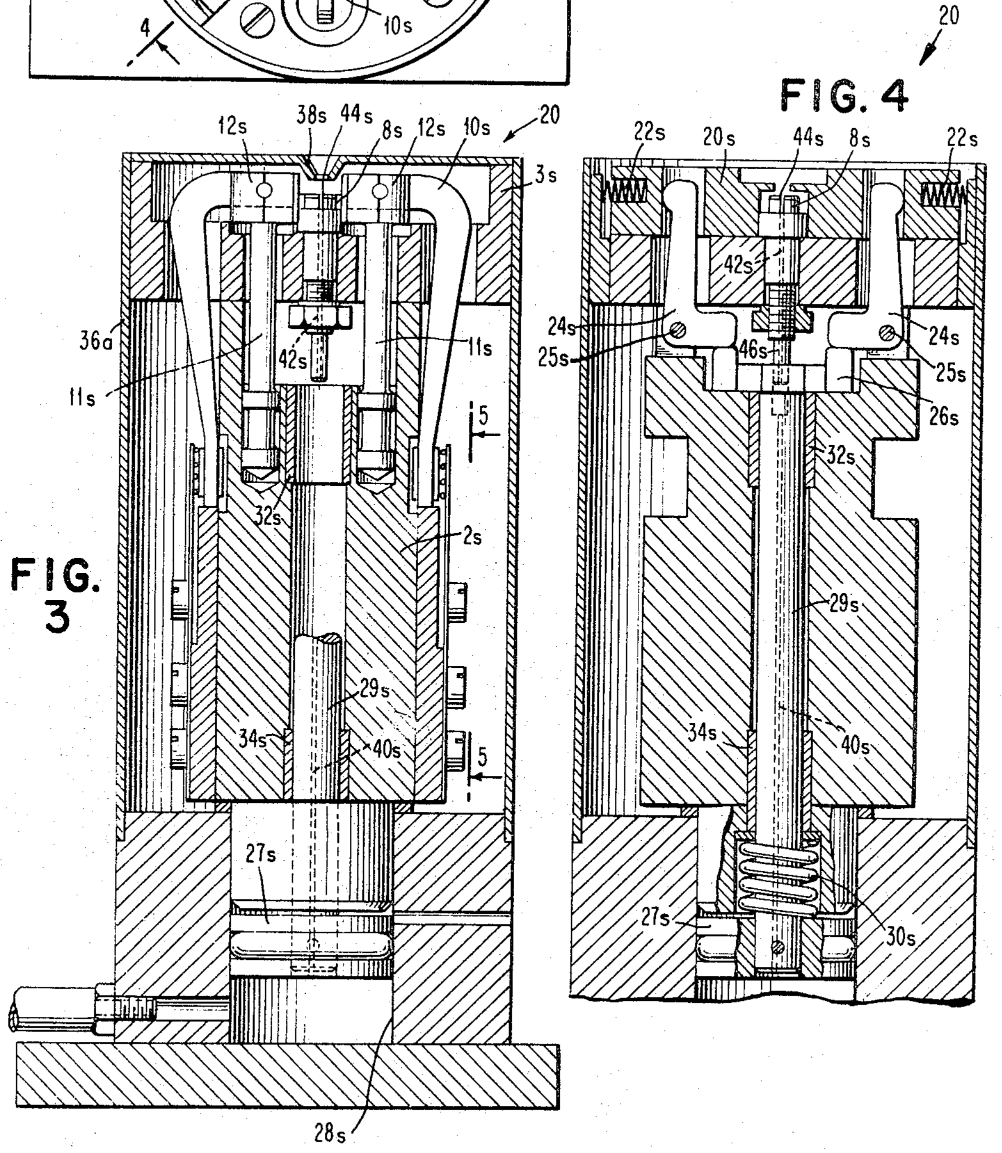
FIG. 3 is a vertical sectional view taken on line 3—3 of FIG. 2.
FIG. 4 is a vertical sectional view taken on line 4—4 of FIG. 2.

In order to more accurately position the semiconductor chip C relative to the blades 4s, 5s, 6s and 7s, a pair of opposing guide jaws 20s are provided which are positioned above the blades. In FIGS. 2 and 4, there is depicted the structure of the guide jaws. The jaws 20s are each provided with two diagonal and transverse surfaces adapted to slidably engage the adjacent edges of the chip. Compression springs 22s are provided to bias the jaws 20s inwardly into operative engagement with a chip to be positioned over the blades. The jaws in effect form a guide channel that corrects any minor misalignment of the chip. In order to open the jaws 20s after the sensing operation is complete, there is provided an air operated actuating mechanism. Two L-shaped arms 24s are pivotally mounted on the head by pins 25s with the upper leg portions in abutting engagement with the jaws 20s and with the lower end portions directed radially inwardly. An abutment element 26s engages both of the inwardly directed legs of arms 24s. A piston 27s is slidably mounted in a cylinder 28s and connected to piston rod 29s. Upward movement of piston 27s forces the abutment element 26s upwardly into actuating engagement with the arms 24s, thus spreading the jaws to allow easy removal of a semiconductor chip from the sensing station. The jaws 20s are opened sufficiently wide to allow a chip that is slightly irregular in shape to leave the station unhindered by the jaws. Closure of the jaws accurately and positively aligns the chip over the blades in position for the sensing operation. Spring 30s biases the piston 27s downwardly to allow springs 22s to close the jaws. A piston rod 29s is slidably supported by sleeve bearings 32s and 34s. Piston 29s is also provided with a longitudinally extending air passage 40s which communicates with air passage 42s, which terminates in opening 44s in the center of blade guide 8s. In operation, when air under pressure is admitted to cylinder 28s, air passes through passages 40s and 42s to escape through opening 44s to blow the chip from the sensing station if it should become dislodged from the probe or any part thereof. The air blast is delayed for an instant that it takes for the top portion of piston rod 29s to couple with the extending tube 46s. A cylindrically shaped housing 36s having a central aperture 38s encloses the entire chip orientation sensor mechanism.

In operation, a semiconductor chip C with the ball terminals extending downwardly is lowered by the pickup probe through aperture 38s and between the jaws 20s which are normally in closed guiding position. The chip is then gently urged downwardly with one ball contact of the chip depressing one of the blades which makes possible the production of an electrical signal. Unless only a single blade is forced down the chip is rejected from the probe after it is removed from the sensor. If, however, the chip is held in an upside down position on the probe, all the blades will be actuated. This will also produce a signal instructing the machine to blow the chip off the probe. Further, if the terminal ball contact intended to contact the knife blade is missing or off location, no blades will be contacted. In this instance the chip will also be rejected. After the sensing operation is completed, the guide jaws are opened by the piston and cylinder, and the probe with chip still attached raised and moved to the chip T-bar orientor 21. An instant after the jaws 20s are opened a stream of air will issue from opening 44s to blow out the chip if it should become dislodged from the probe, or any part thereof that may have broken off. This leaves the sensing station clear to receive the next chip.

It is to be understood that the afore-described apparatus is simply illustrative of the application of the principles of the invention. Numerous other arrangements and adaptations may be readily devised by those skilled in the art which would embody the principles of the invention and fall within the spirit and scope thereof.

We claim:

1. An apparatus for successively sensing the angular position of semiconductor chips having three ball contacts arranged in a triangular relation comprising, a base, a head mounted on said base, a blade guide mounted on said head and having a concave depression and four relatively thin radially arranged slots, four pivoted L-shaped arms, means pivotally supporting said arms adjacent said blade guide, each of said L-shaped arms arranged with a relatively long leg portion extending downwardly and a relatively short leg portion directed inwardly generally in alignment with one of said slots, a relatively thin blade mounted on each of said arms on the short leg thereof with a portion disposed in one of said slots in said blade guide, an electrical switch associated with each of said blades, each of said electrical switches having a first flexible electrical contact on said base positioned in overlying relation to the end portion of a downwardly extending long leg portion of one of L-shaped arms, and second electrical contact on said base positioned in spaced relation to said first flexible electrical contact, means for aligning a chip relative to said blades comprising, a pair of slidable diametrically positioned guide jaws on said head, chip engaging portions on said jaws positioned above and adjacent said blade guide, resilient means biasing said jaws inwardly, means for opening said jaws, said last mentioned means having L-shaped levers, each lever having one end in abutting engagement with one of said jaws, a piston and cylinder, a piston rod in operative actuating engagement with the opposite ends of said levers, an air passage communicating with said cylinder and terminating in said blade guide, said apparatus in use adapted to sense the angular position of the chip when the chip with the ball contacts down is moved downwardly guided by said jaws into contact with said blades, and produce an electrical signal with the electrical switches in response to actuation of said blades by the ball contacts.

2. An apparatus for successively sensing the angular position of semiconductor chips having a geometric arrangement of ball contacts comprising, a base, a head mounted on said base, a blade guide having a concave depression and a plurality of relatively thin radially arranged slots, a plurality of pivoted L-shaped arms, means pivotally supporting said arms adjacent said blade guides, each of said L-shaped arms arranged with a relatively long leg portion extending downwardly adjacent said base, and a relatively short portion directed inwardly in alignment with one of said slots, a relatively thin blade mounted on each of said arms with a portion disposed in one of said slots in said blade guide, an electrical switch associated with each of said blades, each of said electrical switches having a first electrical contact positioned in overlying relation to the end portion of a downwardly extending long leg portion of one of said L-shaped arms, and a second electrical contact positioned in space relation to said first electrical contact, means for aligning a chip relative to said blades, said last mentioned means having a pair of slidable diametrically positioned guide jaws, chip engaging portions on said guide jaws positioned above and adjacent said blade guides, means biasing said jaws inwardly, means for opening said guide jaws including a piston, a cylinder enclosing said piston, a piston rod connected to said piston, linkage means connecting said piston rod and said jaws, said apparatus in use adapted to sense the angular position of chip when the chip with the ball contacts down is moved downwardly guided by said jaws into contact with said blades, and produce an electrical signal with the electrical switches in response to actuation of said blades by said ball contacts.

3. An apparatus for sensing the angular position of semiconductor chips having a plurality of geometrically arranged contacts comprising, a blade guide having a plurality of relatively thin radially arranged slots, a plurality of pivoted arms, means pivotally supporting said arms adjacent said blade guides, each of said arms having a relatively long leg portion and a relatively short leg portion directed inwardly in alignment with one of said slots, a relatively thin blade mounted on each of said arms on the short leg thereof with a portion disposed in one of said slots in said blade guide, an electrical switch associated with each of said blades, each of said electrical switches having a first flexible electrical contact positioned in overlying relation to the end portion of the long leg portion of one of said arms, and a second electrical contact positioned in spaced relation to said first flexible electrical contact, means for aligning a chip relative to said blades, said last mentioned means including a pair of diametrically positioned guide jaws having chip engaging portions thereon, means for actuating said jaws, said last mentioned means having a power means, and linkage means in actuating engagement with said jaws, said apparatus in use adapted to sense the position of the contacts when the chip is moved downwardly and guided by said jaws into contact with said blades, and to produce a signal in response to actuation of said blades by said contacts.

4. An apparatus for sensing the angular position of work pieces having a geometrical arrangement of protruding portions arranged thereon, comprising, a blade guide, a plurality of pivoted arms, a thin blade mounted on one end of each of said arms and having a portion thereof disposed in movable supporting engagement in said blade guide, an electrical switch associated with each of said blades in operative engagement with the other end of each of said arms, means for aligning a work piece relative to said blades comprising at least one guide jaw having a work piece engaging surface thereon positioned adjacent said blade guide, means for moving said jaw, said apparatus in use adapted to sense the angular position of the work piece when same is moved into operative engagement with said blades, and produce an electrical signal in response to the position of said protruding portions of said work piece.

5. An apparatus for sensing the angular position of a work piece having at least one protruding portion thereon comprising, a sensing station, a plurality of movable sensing elements at said sensing station adapted in use to selectively engage said protruding portion of said work piece, a plurality of electrical switches, linkage means operatively connecting each of said sensing elements in actuating relation to one of said electrical switches, and means for accurately positioning a work piece in sensing position at said sensing station, said above mentioned means having a pair of radially movable guide jaws having work piece engaging portions thereon positioned adjacent said sensing station, means to move said guide jaws into and out of guiding position, said sensing apparatus in use adapted to sense the angular position of a work piece when the protruding portion thereof is moved into operative engagement with said sensing elements, and produce an electrical signal in response to actuation of said sensing elements by said protruding elements.

6. An apparatus for sensing the position of a workpiece having at least one identifiable physical feature thereon comprising, a plurality of sensing elements each adapted to sense the presence or absence of said feature of said workpiece, a plurality of electrical circuit control elements, means operatively associating said sensing elements with said circuit control elements in actuating relationship, means for positioning a workpiece in sensing position relative to said sensing elements, said means for positioning including at least one movable workpiece engaging surface thereon, and means to move said surface into and out of guiding position, said sensing elements positioned on said apparatus for selective actuation by said feature of said workpiece, which actuation of the respective sensing elements is dependent on the relative position of the workpiece being sensed, and said sensing apparatus adapted in use to produce unique electrical signals for differing angular positions of a workpiece using said feature as a reference.

References Cited

UNITED STATES PATENTS 1,871,382 8/1932 Meyer ------------ 192—125 X

EVON C. BLUNK, *Primary Examiner.*

EDWARD A. SROKA, *Examiner.*